United States Patent
Kim et al.

(10) Patent No.: US 10,522,600 B2
(45) Date of Patent: Dec. 31, 2019

(54) ORGANIC LIGHT-EMITTING DISPLAY DEVICE

(71) Applicant: LG DISPLAY CO., LTD., Seoul (KR)

(72) Inventors: Young-Wook Kim, Seoul (KR);
Hyun-Jong Noh, Goyang-si (KR);
Seong-Han Hwang, Goyang-si (KR);
Chi-Myung Ahn, Paju-si (KR);
Won-Hoe Koo, Goyang-si (KR);
Ji-Hyang Jang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 24 days.

(21) Appl. No.: 15/797,802

(22) Filed: Oct. 30, 2017

(65) Prior Publication Data
US 2018/0122874 A1 May 3, 2018

(30) Foreign Application Priority Data
Oct. 31, 2016 (KR) .................. 10-2016-0143309

(51) Int. Cl.
*H01L 27/32* (2006.01)
*H01L 51/52* (2006.01)

(52) U.S. Cl.
CPC ........ *H01L 27/3232* (2013.01); *H01L 27/322* (2013.01); *H01L 27/3213* (2013.01); *H01L 51/5275* (2013.01)

(58) Field of Classification Search
CPC ................................................. H01L 27/3232
See application file for complete search history.

(56) References Cited

U.S. PATENT DOCUMENTS

| | | | | |
|---|---|---|---|---|
| 2008/0024402 A1* | 1/2008 | Nishikawa | .......... | H01L 51/5209 345/82 |
| 2010/0320494 A1* | 12/2010 | Kim | ..................... | G02B 5/3033 257/98 |
| 2013/0307759 A1* | 11/2013 | Jang | ....................... | H01L 27/322 345/76 |
| 2014/0044953 A1* | 2/2014 | Tomoguchi | ............... | C09J 9/00 428/317.3 |
| 2015/0129852 A1* | 5/2015 | Park | ................... | H01L 27/3262 257/40 |
| 2015/0380466 A1* | 12/2015 | Koo | .................... | H01L 27/3258 257/40 |

FOREIGN PATENT DOCUMENTS

KR   10-2013-0106754 A   9/2013

* cited by examiner

*Primary Examiner* — Xia L Cross
(74) *Attorney, Agent, or Firm* — Birch, Stewart, Kolasch & Birch, LLP (57) ABSTRACT

Disclosed is an organic light-emitting display device having a micro lens array (MLA) structure applied to a display panel in order to improve light extraction efficiency. In the organic light-emitting display device, an optical device, including a reactive mesogen (RM) and a dye, is provided between a polarizer and a quarter wave plate (QWP) to block light spreading to a viewing angle, thereby reducing a diffuse reflection component due to the application of the MLA structure.

10 Claims, 7 Drawing Sheets

FIG. 1

|  | COMPARATIVE EXAMPLE 1 | COMPARATIVE EXAMPLE 2 |
|---|---|---|
| REFLECTANCE (SCI) | 1.15 | 1.86 |
| REFLECTANCE (SCE) | 0.03 | 0.74 |
| L *(SCE) | 0.69 | 7.02 |

|  | COMPARATIVE EXAMPLE 2 | EXAMPLE |
|---|---|---|
| REFLECTANCE (SCI) | 1.86 | 1.61 |
| REFLECTANCE (SCE) | 0.74 | 0.41 |
| L*(SCE) | 7.02 | 3.95 |

ORGANIC LIGHT-EMITTING DISPLAY DEVICE

CROSS-REFERENCE TO RELATED APPLICATIONS

This application claims the priority benefit of Korean Patent Application No. 10-2016-0143309, filed on Oct. 31, 2016, which is hereby incorporated by reference as if fully set forth herein.

BACKGROUND OF THE INVENTION

Field of the Invention

The present invention relates to an organic light-emitting display device, and more particularly to an organic light-emitting display device having improved light extraction efficiency.

Discussion of the Related Art

With increasing interest in information displays and increasing demand for portable information media, research into and commercialization of lightweight thin display devices have been intensively conducted on in recent years.

One of the remarkable display devices is a liquid crystal display (LCD) device, which is lightweight and is characterized by low power consumption.

There is an organic light-emitting display device, which is of a self-emissive type and thus has a wider viewing angle and a higher contrast ratio than the LCD device, as another display device. In addition, no backlight is needed in the organic light-emitting display device, whereby the organic light-emitting display device is lightweight and thin. The organic light-emitting display device is advantageous in terms of power consumption. In addition, the organic light-emitting display device has other advantages in that the organic light-emitting display device can be driven using low-voltage direct current and has a short response time.

In the organic light-emitting display device, light emitted from an organic emission layer exits from the organic light-emitting display device via various elements of the organic light-emitting display device.

However, some of the light emitted from the organic emission layer is captured in the organic light-emitting display device, whereby the light extraction efficiency of the organic light-emitting display device is reduced.

In order to improve the light extraction efficiency of the organic light-emitting display device, a micro lens array (MLA) is attached to the outside of a substrate of the organic light-emitting display device.

Korean Patent Application No. 10-2012-0100222 filed on Sep. 11, 2012 (published as KR 10-2013-0106754 on Sep. 30, 2013) and entitled "ORGANIC LIGHT-EMITTING DISPLAY DEVICE AND METHOD OF MANUFACTURING THE SAME" discusses (Korean Patent Application No. 10-2012-0100222) discusses a related art organic light-emitting display device.

According to the related art, a bottom emission type organic light-emitting display device is an organic light-emitting display device configured such that light emitted from an organic light-emitting device is directed toward the lower part of a display panel. That is, the bottom emission type organic light-emitting display device is an organic light-emitting display device configured such that light emitted from an organic light-emitting device is directed toward the lower surface of a substrate on which a thin film transistor for driving the organic light-emitting display device is formed.

In the bottom emission type organic light-emitting display device, light emitted from the organic emission layer may be transmitted in an ITO/organic mode (hereinafter, referred to as an 'ITO mode'), a substrate mode, and an air mode. In the air mode, some of the light emitted from the organic emission layer exits from the organic light-emitting display device. In the substrate mode, some of the light emitted from the organic emission layer is captured in the organic light-emitting display device by total reflection and absorption performed on the substrate. In the ITO mode, some of the light emitted from the organic emission layer is captured in the organic light-emitting display device by total reflection and absorption performed on a positive electrode, which is generally made of ITO.

In the bottom emission type organic light-emitting display device, the amount of light captured in the organic light-emitting display device in the ITO mode is about 50% the amount of light emitted from the organic emission layer, and the amount of light captured in the organic light-emitting display device in the substrate mode is about 30% the amount of light emitted from the organic emission layer. That is, about 80% of light emitted from the organic emission layer is captured in the organic light-emitting display device, and therefore only 20% of light emitted from the organic emission layer is extracted outside.

MLA is a technology for extracting the light captured in the organic light-emitting display device to improve optical efficiency.

However, MLA has a side effect in that reflection performance is reduced. In particular, a diffuse reflection component is increased and thus needs to be controlled.

Figure 1:
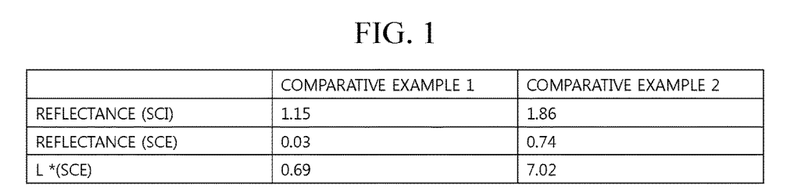
FIG. 1 is a table showing a comparison between the reflectance of a general organic light-emitting display device and the reflectance of an organic light-emitting display device having an MLA structure applied thereto according to a related art.

FIG. 1 is a table showing a comparison between the reflectance of a general organic light-emitting display device and the reflectance of an organic light-emitting display device having an MLA structure applied thereto according to a related art.

In FIG. 1, a specular component excluded (SCE) method is a method of measuring a color excluding specularly reflected light. A method of measuring a color including specularly reflected light in order to complete an integrating sphere is referred to as a specular component included (SCI) method.

Referring to FIG. 1, for example, the total reflectance and diffuse reflectance of a general organic light-emitting display device (Comparative Example 1) according to the related art are 1.15 and 0.03, respectively.

In contrast, the total reflectance and diffuse reflectance of an organic light-emitting display device having an MLA structure applied thereto (Comparative Example 2) according to the related art are 1.86 and 0.74, respectively. It can be seen that the total reflectance of Comparative Example 2 is increased by about 62% and that the diffuse reflectance of Comparative Example 2 is reduced by about 2400% compared to those of Comparative Example 1.

In Comparative Examples 1 and 2, the values of CIE L* are about 0.69 and 7.02, respectively.

In the related art, if the MLA structure is applied to the conventional organic light-emitting display device in order to improve the efficiency of the organic light-emitting display device, a side effect causing the reduction of reflection performance occurs, although the efficiency of the organic light-emitting display device may be improved. Particularly, a diffuse reflection component is increased, which is a limitation associated with the related art.

SUMMARY OF THE INVENTION

Accordingly, the present invention is directed to an organic light-emitting display device that substantially obviates one or more problems due to limitations and disadvantages of the related art.

An object of the present invention is to provide an organic light-emitting display device having improved light extraction efficiency and further increased lifespan.

Another object of the present invention is to provide an organic light-emitting display device configured such that a diffuse reflection component due to the application of a micro lens array (MLA) structure is reduced, thereby preventing or minimizing the reduction of reflection performance.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light-emitting display device includes an overcoating layer provided on a substrate, the overcoating layer having a lens array provided at an emission region of each sub-pixel, an organic light-emitting diode provided on the overcoating layer, and an optical member provided under the substrate, the optical member including a phase difference layer, an optical device, and a linear polarizer.

The optical device may include a reactive mesogen and a dye.

The organic light-emitting display device may further include RGB color filters disposed respectively at the emission regions of RGB sub-pixels.

The lens array may be located at a portion of the overcoating layer that overlaps each of the RGB color filters.

The lens array may have a hemispherical shape or a semi-oval shape.

The phase difference layer may be made of a quarter wave plate.

The optical device may be located between the phase difference layer and the linear polarizer.

The reactive mesogen may be oriented perpendicular to a polarizing axis of the linear polarizer.

The dye may be a black-based dichroic dye, and may be oriented perpendicularly in a same orientation direction as the perpendicularly-oriented reactive mesogen.

The optical device may be formed in a stripe shape extending in one direction so as to correspond to a plurality of white sub-pixels SPw arranged in the one direction.

The optical device may be formed in the shape of sub-pixels so as to correspond to the white sub-pixels one by one.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Hereinafter, exemplary embodiments of an organic light-emitting display device according to the present invention will be described in detail with reference to the accompanying drawings so that the present invention will be easily realized by those skilled in the art.

Advantages and features of the present invention and a method of achieving the same will be more clearly understood from embodiments described below with reference to the accompanying drawings. However, the present invention is not limited to the following embodiments but may be implemented in various different forms. The embodiments are provided merely to complete the disclosure of the present invention and to fully inform a person having ordinary skill in the art to which the present invention pertains of the category of the invention. The invention is defined only by the category of the claims. Wherever possible, the same reference numbers will be used throughout the specification to refer to the same or like elements. In the drawings, the sizes of layers and regions may be exaggerated for clarity of description.

When an element or a layer is referred to as being "on" another element or another layer, it can be directly on the element or the layer, or one or more intervening elements or layers may also be present. In contrast, when an element or a layer is referred to as being "directly on" another element or another layer, it means that no intervening elements or layers are present.

Spatially relative terms such as "below," "beneath," "lower," "above," or "upper" may be used herein to describe one element's relationship to another element as illustrated in the drawings. It will be understood that spatially relative terms are intended to encompass different orientations of the elements during the use or operation of the elements in addition to the orientation depicted in the drawings. For example, if the elements in one of the drawings are turned over, elements described as "below" or "beneath" other elements would then be oriented "above" the other elements. The exemplary terms "below" or "beneath" can, therefore, encompass both the orientation of above and below.

The terminology used in this specification is for the purpose of describing particular embodiments only and is not intended to limit the present invention. As used in this specification, the singular forms are intended to include the plural forms as well, unless the context clearly indicates otherwise. It will be further understood that the terms "comprises" and/or "comprising," when used in this specification, specify the presence of stated elements, steps, and/or operations, but do not preclude the presence or addition of one or more other elements, steps, and/or operations.

Figure 2:
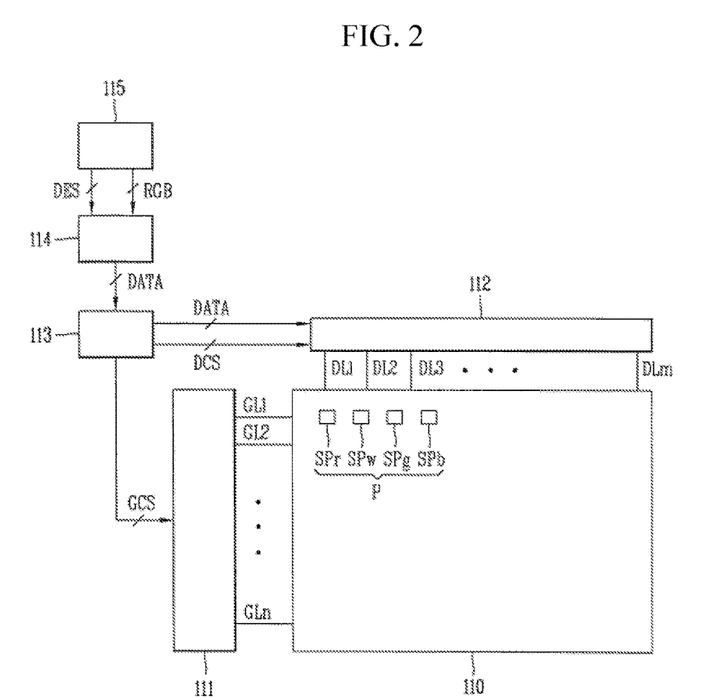
FIG. 2 is a block diagram schematically showing an organic light-emitting display device according to an embodiment of the present invention.

FIG. 2 is a block diagram schematically showing an organic light-emitting display device according to an embodiment of the present invention. A white organic light-emitting display device is shown by way of example. All the components of the organic light-emitting display device according to all embodiments of the present invention are operatively coupled and configured.

Referring to FIG. 2, the organic light-emitting display device according to the present invention may include an image processing unit 115, a data conversion unit 114, a timing control unit 113, a data drive unit 112, a gate drive unit 111, and a display panel 110.

The image processing unit 115 performs various kinds of image processing, such as setting of gamma voltage, in order to realize maximum luminance according to an average image level using an RGB data signal RGB, and outputs the RGB data signal RGB. The image processing unit 115 outputs a drive signal including at least one selected from among a vertical synchronizing signal Vsync, a horizontal synchronizing signal Hsync, a data enable signal DES, and a clock signal CLK, in addition to the RGB data signal RGB.

The timing control unit 113 receives a drive signal including at least one selected from among a vertical synchronizing signal Vsync, a horizontal synchronizing signal Hsync, a data enable signal DES, and a clock signal CLK from the image processing unit 115 or the data conversion unit 114. The timing control unit 113 outputs a gate timing control signal GCS for controlling operation timing of the gate drive unit 111 and a data timing control signal DCS for controlling operation timing of the data drive unit 112 based on the drive signal.

The timing control unit 113 outputs a data signal DATA, in addition to the gate timing control signal GCS and the data timing control signal DCS.

The data drive unit 112 samples and latches the data signal DATA, received from the timing control unit 113, in response to the data timing control signal DCS, received from the timing control unit 113, to covert the data signal into gamma reference voltage, and outputs the converted data signal DATA. The data drive unit 112 outputs the converted data signal DATA through data lines DL1 to DLn. The data drive unit 112 is configured in the form of an integrated circuit (IC).

The gate drive unit 111 outputs a gate signal while shifting the level of gate voltage in response to the gate timing control signal GCS, received from the timing control unit 113. The gate drive unit 111 outputs the gate signal through gate lines GL1 to GLm. The gate drive unit 111 is configured in the form of an IC, or is formed in the display panel 110 so as to have a gate-in-panel (GIP) structure.

For example, the display panel 110 may be configured to have a sub-pixel structure including a red sub-pixel pixel SPr, a green sub-pixel SPg, a blue sub-pixel SPb, and a white sub-pixel SPw. That is, one pixel P may be made of RGB sub-pixels SPr, SPg, and SPb and a white sub-pixel SPw.

Figure 3:
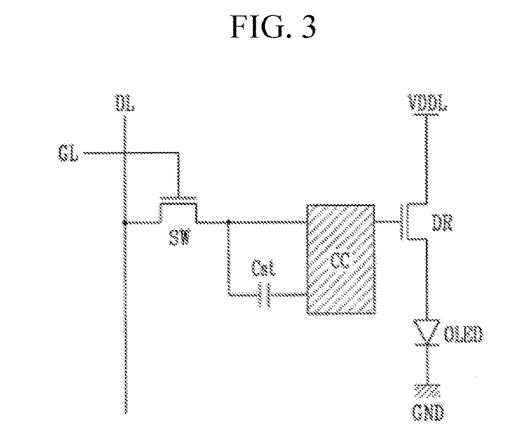
FIG. 3 is a view exemplarily showing the circuit of a sub-pixel of the organic light-emitting display device according to an embodiment of the present invention.

FIG. 3 is a view exemplarily showing the circuit of a sub-pixel of the organic light-emitting display device. For instance, the sub-pixel configuration of FIG. 3 can be applied to each sub-pixel of the organic-light emitting display device of FIG. 2 or to any other organic light-emitting display device according to any other embodiments of the present invention.

The sub-pixel shown in FIG. 3 by way of example is configured to have a 2T(Transistor)1C(Capacitor) structure including a switching transistor, a drive transistor, a capacitor, and an organic light-emitting diode. However, the present invention is not limited thereto. In the case in which a compensation circuit is included, the sub-pixel may be configured to have various structures, such as 3T1C, 4T2C, and 5T2C structures.

Referring to FIG. 3, the sub-pixel of the organic light-emitting display device is defined by a gate line GL, arranged in a first direction, and a data line DL and a drive power line VDDL, arranged in a second direction, which intersects the first direction, while being spaced apart from each other.

One sub-pixel may include a switching transistor SW, a drive transistor DR, a capacitor Cst, a compensation circuit CC, and an organic light-emitting diode OLED.

The organic light-emitting diode OLED emits light according to drive current formed by the drive transistor DR.

The switching transistor SW performs switching operation such that a data signal received through the data line DL is stored in the capacitor Cst as data voltage in response to a gate signal received through the gate line.

The drive transistor DR performs operation such that drive current flows between the drive power line VDDL and a ground wire GND according to the data voltage stored in the capacitor Cst.

The compensation circuit CC compensates the threshold voltage of the drive transistor DR. The compensation circuit CC may include at least one transistor and a capacitor. The compensation circuit CC may be variously configured, and a detailed illustration and description thereof will be omitted or brief.

Depending on the structure thereof, the sub-pixel having the above-stated construction may be configured to have a top emission structure, a bottom emission structure, or a dual emission structure.

In addition, depending on how full color is realized, the sub-pixel may be classified as an individual RGB light-emission type sub-pixel, a sub-pixel using a WOLED and a color filter, or a color conversion type sub-pixel.

The organic light-emitting display device according to the various embodiments of the present invention has advantages in that full color is realized using WOLEDs and RGB color filters, thereby achieving high resolution, and the area of the organic light-emitting display device is increased through a simple process. However, the present invention is not limited thereto.

Figure 4:
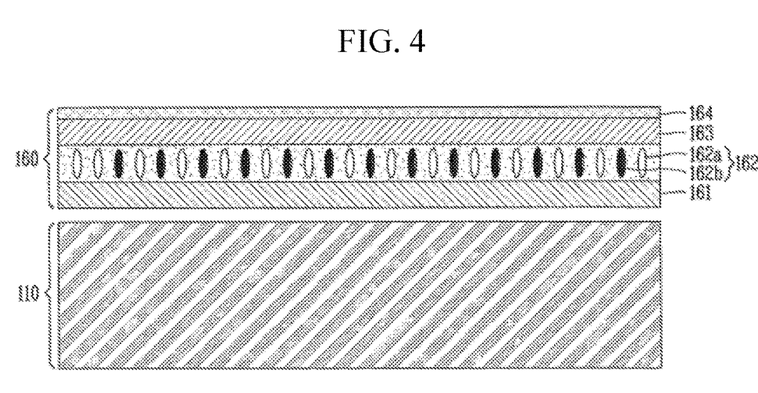
FIG. 4 is a sectional view exemplarily showing the structure of an organic light-emitting display device according to a first embodiment of the present invention.

FIG. 4 is a sectional view exemplarily showing the structure of an organic light-emitting display device according to a first embodiment of the present invention.

Figure 5:
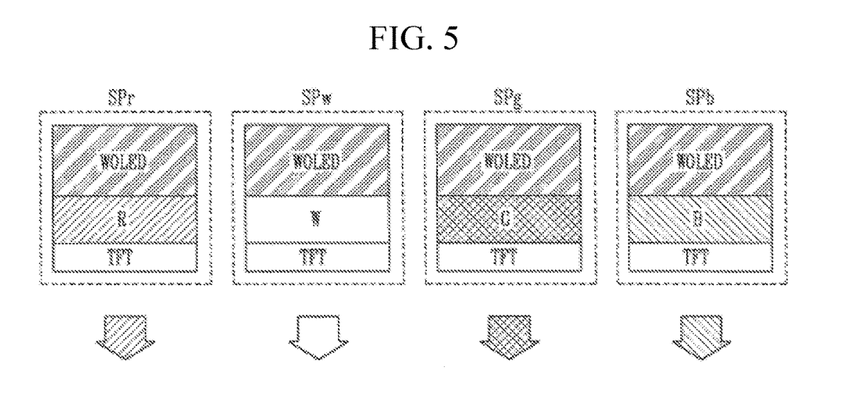
FIG. 5 is a view exemplarily showing the structure of WRGB sub-pixels of the organic light-emitting display device according to the first embodiment of the present invention shown in FIG. 4.

FIG. 5 is a view exemplarily showing the structure of WRGB sub-pixels of the organic light-emitting display device according to the first embodiment of the present invention shown in FIG. 4.

Figure 6:
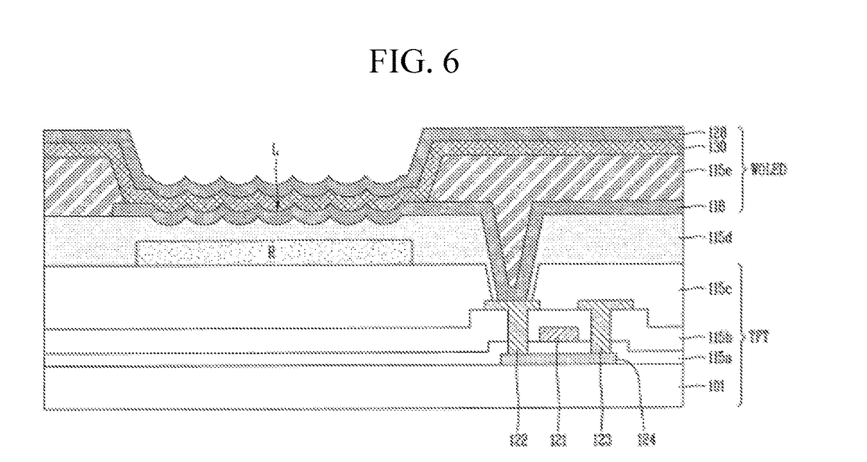
FIG. 6 is a sectional view schematically showing the structure of a sub-pixel of the organic light-emitting display device according to the first embodiment of the present invention shown in FIG. 4.

FIG. 6 is a sectional view schematically showing the structure of a sub-pixel of the organic light-emitting display device according to the first embodiment of the present invention shown in FIG. 4. FIG. 6 shows a red sub-pixel SPr of the organic light-emitting display device using a thin film transistor having a coplanar structure by way of example. However, the present invention is not limited to a thin film transistor having a coplanar structure, and is applicable to other types or structures.

Figure 7:
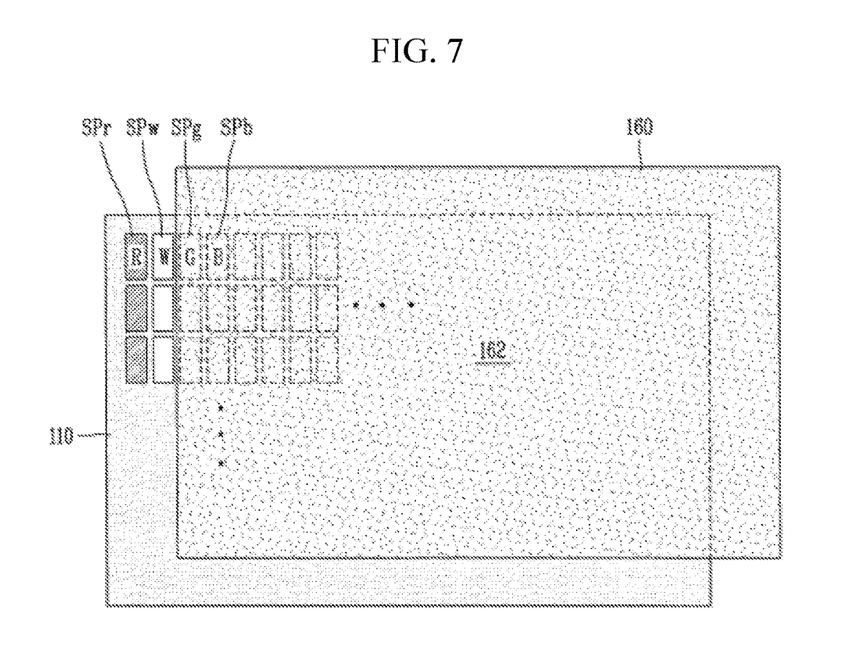
FIG. 7 is an exploded perspective view exemplarily showing the structure of the organic light-emitting display device according to the first embodiment of the present invention.

FIG. 7 is an exploded perspective view exemplarily showing the structure of the organic light-emitting display device according to the first embodiment of the present invention. More specifically, FIG. 7 schematically shows the structure of a panel assembly including a display panel and an optical member.

The organic light-emitting display device shown in FIGS. 4 to 7 by way of example is a bottom emission type organic light-emitting display device, in which light is emitted toward a substrate in which pixels are arranged. However, the present invention is not limited thereto. The organic light-emitting display device according to the present invention may be a top emission type organic light-emitting display device, in which light is emitted toward the opposite side of a substrate in which pixels are arranged.

The organic light-emitting display device shown in FIGS. 4 to 7 by way of example includes WOLEDs that emit white using at least two organic emission layers. In this case, RGB filters for converting white into red, green, and blue may be used, since the organic emission layers emit white light.

The organic light-emitting display device according to the first embodiment of the present invention includes a panel assembly for displaying an image and a flexible circuit board connected to the panel assembly.

Referring to FIGS. 4 to 7, the panel assembly is formed on a substrate 101, and includes a display panel 110, which is divided into an active region and a pad region, and a thin film encapsulation layer provided on the display panel 110 so as to cover the active region.

In a bottom emission structure, an optical member 160 according to a first embodiment of the present invention may be attached to the lower surface of the substrate 101 in order to prevent the reflection of light incident from outside.

In the active region of the display panel 110, a plurality of WRGB sub-pixels SPr, SPg, SPb, and SPw may be arranged in the form of a matrix.

The WRGB sub-pixels SPr, SPg, SPb, and SPw may be configured to use white organic light-emitting diodes WOLEDs and color filters R, G, B, and W. The white color filter W may be applied to the white sub-pixel SPw, or no color filter may be applied to the white sub-pixel SPw.

The RGB sub-pixels SPr, SPg, and SPb may include transistors TFT, RGB color filters R, G, and B, and white organic light-emitting diodes WOLEDs. For example, in the cases in which no color filter is applied to the white sub-pixel SPw, the white sub-pixel SPw may include a transistor TFT and a white organic light-emitting diode WOLED.

That is, the RGB sub-pixels SPr, SPg, and SPb include RGB color filters R, G, and B for converting white light emitted from the white organic light-emitting diodes WOLEDs into red, green, and blue light. In contrast, the white sub-pixel SPw may include no color filter, since white light emitted from the white organic light-emitting diode WOLED is output outside without being changed.

The structure of a sub-pixel, e.g., a red sub-pixel SPr, will be described in detail with reference to FIG. 6. The red sub-pixel SPr may include a transistor TFT, a white organic light-emitting diode WOLED, and a red color filter R, formed on a substrate 101.

The transistor TFT may be a drive thin film transistor, which includes a semiconductor layer 124, a gate electrode 121, a source electrode 122, and a drain electrode 123.

The semiconductor layer 124 may be formed on a substrate 101 made of an insulating material, such as transparent plastic or a polymer film.

The semiconductor layer 124 may be made of an amorphous silicon film, a poly-crystalline silicon film obtained by crystallizing amorphous silicon, or an oxide semiconductor.

A buffer layer may be further provided between the substrate 101 and the semiconductor layer 124. The buffer layer may be formed to protect a transistor TFT, formed in a subsequent process, from impurities that are discharged from the substrate 101, such as alkaline ions.

A gate insulation film 115a made of a silicon nitride film SiNx or a silicon oxide film $SiO_2$ may be formed on the semiconductor layer 124, and a gate line including a gate electrode 121 and a first maintenance electrode may be formed on the gate insulation film.

The gate electrode 121, the gate line, and the first maintenance electrode may have a single-layer or multi-layer structure made of a first metal material having low resistance, such as aluminum (Al), copper (Cu), molybdenum (Mo), chrome (Cr), gold (Au), titanium (Ti), nickel (Ni), neodymium (Nd), or an alloy thereof.

An inter-insulation layer 115b made of a silicon nitride film or a silicon oxide film may be formed on the gate electrode 121, the gate line, and the first maintenance electrode, and a data line, a drive voltage line, source and drain electrodes 122 and 123, and a second maintenance electrode may be formed on the inter-insulation layer.

The source electrode 122 and the drain electrode 123 may be spaced apart from each other by a predetermined distance, and may be electrically connected to the semiconductor layer 124. More specifically, a semiconductor layer contact hole, through which the semiconductor layer 124 is exposed, may be formed in the gate insulation film 115a and the inter-insulation layer 115b, and the source and drain electrodes 122 and 123 may be electrically connected to the semiconductor layer 124 through the semiconductor layer contact hole.

The second maintenance electrode may partially overlap the first maintenance electrode, located under the second maintenance electrode, in the state in which the inter-insulation layer 115b is disposed therebetween to form a storage capacitor.

The data line, the drive voltage line, the source and drain electrodes 122 and 123, and the second maintenance electrode may have a single-layer or multi-layer structure made of a second metal material having low resistance, such as aluminum (Al), copper (Cu), molybdenum (Mo), chrome (Cr), gold (Au), titanium (Ti), nickel (Ni), neodymium (Nd), or an alloy thereof.

A passivation film (or a planarization film) 115c may be formed on the substrate 101, on which the data line, the drive voltage line, the source and drain electrodes 122 and 123, and the second maintenance electrode are formed.

RGB color filters R, G, and B may be formed on the passivation film 115c. The RGB color filters R, G, and B are color conversion materials for converting white light emitted from white organic light-emitting diodes WOLEDs into red, green, and blue light.

A red sub-pixel SPr, a green sub-pixel SPg, and a blue sub-pixel SPb may be provided with a red color filter R, a green color filter G, and a blue color filter B, respectively.

A white color filter W may be applied to a white sub-pixel SPw, or no color filter may be applied to a white sub-pixel SPw.

An overcoating layer 115d for exposing a portion of the drain electrode 123 and a white organic light-emitting diode WOLED may be provided on the passivation film 115c. The overcoating layer 115d may be made of an organic material having a refractive index of about 1.5. For example, the overcoating layer may be made of any one selected from among an acrylic resin, an epoxy resin, a phenol resin, a polyamide resin, a polyimide resin, an unsaturated polyester resin, a polyphenylene resin, a polyphenylene sulfide resin, benzocyclobutene, and a photoresist. However, the present invention is not limited thereto. The overcoating layer may be made of any insulating material having a refractive index of about 1.5.

The overcoating layer 115d may include a lens array L formed so as to overlap the WRGB filters R, G, B, and W. The lens array L may have a hemispherical shape or a semi-oval shape. The overcoating layer 115d functions as a planarization layer in a portion thereof at which the lens array L is not formed.

A predetermined step reduction layer may be formed on the overcoating layer 115d. The step reduction layer may be made of a material having a higher refractive index than the overcoating layer 115d. For example, the step reduction layer may be made of a material having a refractive index of about 1.7 to 2.0. The step reduction layer is a layer for reducing the height of the step of the overcoating layer 115d formed by the lens array L. That is, the step reduction layer is a layer for partially filling concave regions of the overcoating layer 115d formed by the lens array L such that an organic layer 130 is not formed at peak points of the overcoating layer 115d between the lenses of the lens array L and at points of the overcoating layer 115d at which the lens array L is sharply inclined.

The white organic light-emitting diode WOLED may include a first electrode 118, an organic layer 130, and a second electrode 128.

The first electrode 118, the organic layer 130, and the second electrode 128 are formed along the upper surface of the overcoating layer 115d, which is a non-planarized surface formed by the lens array L. Consequently, the first electrode 118, the organic layer 130, and the second electrode 128 have non-planarized upper and lower surfaces. For example, in the case in which the first electrode 118, the organic layer 130, and the second electrode 128 are formed by deposition, the first electrode 118, the organic layer 130, and the second electrode 128 have shapes formed according to the morphology of the surface at which the first electrode 218, the organic layer 230, and the second electrode 228 are formed.

Moisture may be directly diffused to the organic layer 130 due to outgassing occurring at the WRGB filters R, G, B, and W and the overcoating layer 115d, with the result that the white organic light-emitting diode WOLED may be deteriorated. In order to prevent this, a predetermined passivation film having a thickness of tens to hundreds of nm may be further deposited.

The white organic light-emitting diode WOLED is electrically connected to the drive thin film transistor. More specifically, a drain contact hole, through which the drain electrode 123 of the drive thin film transistor is exposed, may be formed in the passivation film 115c and the overcoating layer 115d formed on the drive thin film transistor. The white organic light-emitting diode WOLED may be electrically connected to the drain electrode 123 of the drive thin film transistor via the drain contact hole. However, the present invention is not limited thereto.

The first electrode 118 may be formed on the overcoating layer 115d, and may be electrically connected to the drain electrode 123 of the drive thin film transistor via the drain contact hole.

The first electrode 118, which supplies current (or voltage) to the organic layer 130, defines an emission region having therein a predetermined area.

The first electrode 118, which is a positive electrode, may include a material having a relatively large work function. For example, the first electrode 118 may include a transparent conductive material, such as indium tin oxide (ITO) or indium zinc oxide (IZO). However, the present invention is not limited thereto.

A bank 115e may be formed on the substrate 101, on which the first electrode 118 is formed. The bank 115e may surround the edge of the first electrode 118 to define an opening, and may be made of an organic insulating material.

Four sub-pixels SPr, SPg, SPb, and SPw may be separated from each other by the bank 115e.

The bank 115e may be made of a sensitive emulsion including a black paint. In this case, the bank 115e may serves as a shading member.

The organic layer 130 and the second electrode 128 may be sequentially formed on the substrate 101, on which the bank 115e is formed.

The organic layer 130 may be formed between the first electrode 118 and the second electrode 128. The organic layer 130 may include an organic emission layer that emits light through the coupling between holes supplied from the first electrode 118 and electrons supplied from the second electrode 128.

The organic layer 130 may be formed as a single layer that is continuous over all pixels. In this case, the organic emission layer may include an organic emission material that emits white light. In this case, RGB color filters R, G, and B may be provided for the RGB sub-pixels SPr, SPg, and SPb in order to express various colors. However, the present invention is not limited thereto.

Generally, a microcavity effect is applied in order to improve the light extraction efficiency of the organic light-emitting display device. The microcavity effect serves to improve light extraction efficiency using light reflectance of an electrode and optical constructive interference. The microcavity effect is achieved using a method of satisfying specific optical conditions constructed when a wavelength corresponding to a specific color is reflected between a reflective electrode and a transflective electrode. The distance between the reflective electrode and the transflective electrode, i.e., the thickness of the organic emission layer, may be adjusted to select the wavelength to be constructed. Theoretically, if an integer multiple of a wavelength corresponding to a specific color is an even-numbered multiple of the thickness of the organic emission layer, constructive interference occurs in the wavelength corresponding to a specific color. The constructive interference condition is represented as follows.

$$2nd = m\lambda$$

Here, n and m are integers, m is the order of a wavelength, d is the thickness of the organic emission layer, and $\lambda$ is a reference wavelength in which constructive interference occurs.

However, the thickness of the organic emission layer is limited due to the optical conditions necessary to achieve the microcavity effect. For example, in the case in which the organic emission layer is configured to have a structure in which two layers are stacked to emit white light, the organic emission layer must have a thickness of about 350 to 400 nm in order to improve light extraction efficiency by applying the microcavity effect. That is, in the case in which the organic emission layer is configured to have a structure in which two layers are stacked to emit white light, the thickness of the organic emission layer must be equal to or greater than 350 nm in order to satisfy the optical conditions necessary to achieve the microcavity effect. Furthermore, if the number of stacked layers of the organic emission layer is increased, the thickness of the organic emission layer must be greatly increased in order to satisfy the optical conditions necessary to achieve the microcavity effect. If the thickness of the organic emission layer is increased, the cost and time for manufacturing the organic emission layer are increased, and drive voltage and power consumption for driving the organic light-emitting display device are also increased.

In the organic light-emitting display device according to the present invention, however, light extraction efficiency is improved by applying a micro lens array (MLA) structure using the overcoating layer 115d, rather than applying the microcavity effect. In the organic light-emitting display device according to the present invention, therefore, it is not necessary to optimize the thickness of the organic emission layer 130 for the optical conditions necessary to achieve the microcavity effect in order to improve light extraction efficiency. As a result, it is possible to greatly reduce the thickness of the organic emission layer 130.

In the organic light-emitting display device according to the present invention having an MLA structure applied thereto, the upper surface of the overcoating layer 115d is patterned in a hemispherical shape to extract light captured in the display panel 110 outside, thereby improving the efficiency of an organic light-emitting device. For example, the organic light-emitting display device according to the present invention has a light extraction efficiency of about 25%, which is higher than the light extraction efficiency of a conventional organic light-emitting display device, which is 20%. Consequently, it is possible to realize an organic light-emitting display device having high efficiency, high luminance, and low power consumption.

A capping layer made of an organic material, such as a polymer, may be formed on the substrate 101, on which the second electrode 128 is formed, so as to cover all portions of the substrate 101 corresponding to pixel portions. However, the present invention is not limited thereto. For instance, the device in the present invention may not have any capping layer.

A multi-layered thin film encapsulation layer may be formed on the capping layer.

A multi-layered protective film for encapsulation may be located so as to be opposite the entire surface of the substrate 101 including the thin film encapsulation layer. An adhesive may be provided between the substrate 101 and the protective film. However, the present invention is not limited thereto. For example, no protective film may be provided.

The thin film encapsulation layer prevents the white organic light-emitting diode WOLED from being deteriorated by ultraviolet light, oxygen, and moisture permeating into the display panel 110. The thin film encapsulation layer may be formed using an ultraviolet sealing method of forming an ultraviolet-curing sealant on the uppermost part of the display panel 110 in the state in which the second electrode 128 is formed and locating a getter at the center thereof. Alternatively, the thin film encapsulation layer may be formed using a frit sealing method of forming a material including inorganic powder, such as glass, on the uppermost part of the display panel 110 in the state in which the second electrode 128 is formed and melting and joining the same using a laser. Alternatively, the thin film encapsulation layer may be formed using a face sealing method of forming an ultraviolet-curing or thermosetting sealant on the uppermost part of the display panel 110 in the state in which the second electrode 128 is formed. Alternatively, the thin film encapsulation layer may be formed using a thin film encapsulation (TFE) method including passivation layers, each of which includes an organic material, and organic insulating layers that are alternately stacked.

As previously described, the optical member 160 according to the first embodiment of the present invention for preventing the reflection of light incident from outside may be provided under the substrate 101.

The optical member 160 restrains the reflection of external light to improve the visibility of the organic light-emitting display device, and minimizes the loss of light emitted outside from the organic light-emitting diode.

The optical member 160 according to the first embodiment of the present invention includes a phase difference layer 161, an optical device 162, and a linear polarizer 163, which are sequentially formed under the substrate 101.

A surface treatment layer 164 made of TAC may be located on the linear polarizer 163.

The phase difference layer 161 may be made of a quarter wave plate (QWP) for generating a phase retardation of $\lambda/4$.

The linear polarizer 163 has a polarizing axis, and linearly polarizes light toward the polarizing axis. Specifically, the linear polarizer 163 transmits light that is aligned with the polarizing axis, and absorbs light that is not aligned with the polarizing axis. When light passes through the linear polarizer 163, therefore, the light is linearly polarized toward the polarizing axis.

The phase difference layer 161 and the linear polarizer 163 may constitute a circular polarizer. That is, when the optical axis of the phase difference layer 161 and the transmission axis of the linear polarizer 163 are disposed such that the angle therebetween is 45 degrees, external light is reflected in the display panel 110, and the reflected light exits in the state of being perpendicular to the transmission axis of the linear polarizer 163, whereby reflectance is decreased.

The optical device 162 according to the first embodiment of the present invention is located between the phase difference layer 161 and the linear polarizer 163, and includes a reactive mesogen (RM) 162a and a dye 162b.

The optical device 162 according to the first embodiment of the present invention is provided over the entire surface of the display panel 110 (see FIG. 7).

The RM 162a may be oriented perpendicular to the polarizing axis of the linear polarizer 163.

The dye 162b, which is a dichroic dye, is oriented perpendicularly in the same orientation direction as the perpendicularly-oriented RM 162a in order to absorb light spreading to a viewing angle. Since the light spreading to the viewing angle is blocked, it is possible to prevent the reduction of reflection performance due to the application of the MLA structure. In addition, the effect of the dye 162b, which absorbs light, on the front may be minimized, since the dye 162b is a perpendicularly-oriented dye.

For example, a liquid crystalline polymer, a liquid crystalline small molecule, or an oligomer having a photosensitive group exhibiting optical anisotropy due to linearly polarized light radiated from outside and a mesogen-forming group exhibiting liquid crystallinity within a specific temperature range or a mixture thereof may be used as the RM 162a of the present invention. However, the present invention is not limited thereto.

The RM 162a may include a polyacrylate main chain and at least one side chain connected to the main chain. The side chain has one or two aromatic materials. A photoreactive material is provided as a terminal group of the side chain, whereby a photo-isomerization reaction or a photo-dimerization reaction occurs. Alternatively, a hydrogen-coupling group may be provided as the terminal group. When linearly polarized light is radiated to the RM 162a, a photo-isomerization reaction and a photo-dimerization reaction occur. When anisotropy occurs in the RM 162a, optical anisotropy may be increased through heat treatment, whereby the RM 162a may be arranged in a specific direction.

The optical device 162 may be mixed with a black-based dichroic dye 162b, in addition to the RM 162a. That is, the dye 162b may be a black dichroic dye obtained by mixing three or more kinds of CMY (or RGB) dyes. The dye 162b is arranged along the side chain of the RM 162a. Since the dye 162 is arranged in a specific direction. When light is incident, therefore, the polarized component that is parallel to the arrangement direction of the dye, i.e., the absorption direction of the dye, is absorbed, and the polarized component that is perpendicular to the absorption direction of the dye is transmitted.

The optical device 162 according to the present invention has +C plate characteristics, in which a refractive index nx in the x-axis direction and a refractive index ny in the y-axis direction are substantially equal and these refractive indices are lower than a refractive index nz in the z-axis direction (i.e., the orientation direction of the RM 162a).

Figure 8:
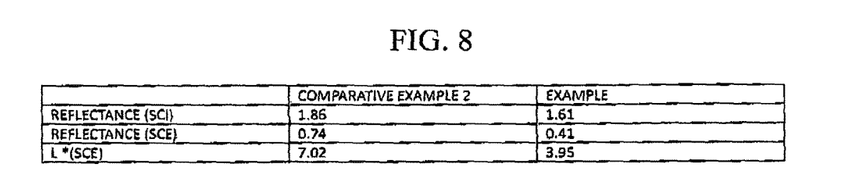
FIG. 8 is a table showing a comparison between the reflectance of a general organic light-emitting display device having an MLA structure applied thereto and the reflectance of the organic light-emitting display device according to an example of the present invention.

FIG. 8 is a table showing a comparison between the reflectance of a general organic light-emitting display device having an MLA structure applied thereto and the reflectance of the organic light-emitting display device according to the present invention.

Figure 9:
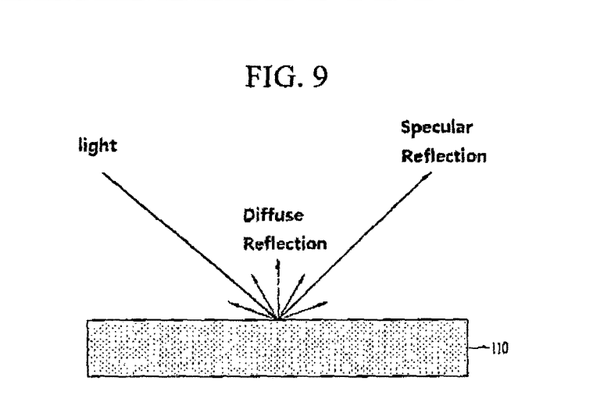
FIG. 9 is a view illustrating specular reflection and diffuse reflection.

FIG. 9 is a view illustrating specular reflection and diffuse reflection.

Referring to FIG. 8, for example, the total reflectance and diffuse reflectance of a general organic light-emitting display device having an MLA structure applied thereto (Comparative Example 2) are 1.86 and 0.74, respectively.

In contrast, the total reflectance and diffuse reflectance of the organic light-emitting display device according to the present invention having an MLA structure applied thereto (Example) are 1.61 and 0.41, respectively. It can be seen that the total reflectance of Example is decreased by about 13% and that the diffuse reflectance of Example is decreased by about 45%, compared to those of Comparative Example 2.

In Comparative Example 2 and Example, the values of CIE L* are about 7.02 and 3.95, respectively.

For reference, total reflectance and diffuse reflectance have the following meanings.

For example, when a ball is thrown against a wall, the throwing angle and the bouncing angle of the ball are the same. Referring to FIG. 9, the reflection of light having the same incidence angle and reflection angle is referred to as specular reflection (or regular reflection). Specularly reflected light is the same as light reflected by a mirror.

The rate of spread of light in various directions without being specularly reflected is referred to as diffuse reflectance. The sum of specular reflectance Rs and diffuse reflectance Rd is referred to as total reflectance.

A method of measuring a color excluding specularly reflected light is referred to as a specular component excluded (SCE) method. A method of measuring a color including specularly reflected light in order to complete an integrating sphere is referred to as a specular component included (SCI) method.

When the SCE method is used, specularly reflected light is completely excluded, and therefore only diffusely reflected light is measured. In this method, when an observer looks at the color of an object, it is possible to evaluate the color through the correlation thereof.

When the SCI method is used, specular reflectance and diffuse reflectance are included. With this method, it is possible to evaluate a color without influence from the state of a surface.

Figure 10:
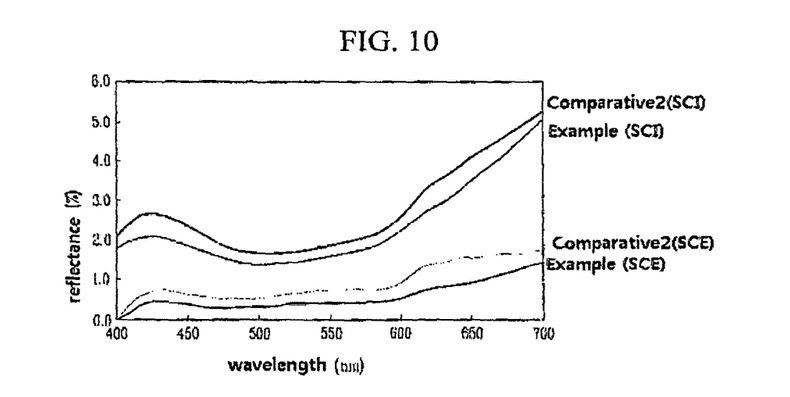
FIG. 10 is a graph showing reflectance based on wavelength by way of example.

FIG. 10 is a graph showing reflectance based on wavelength by way of example.

FIG. 10 shows total reflectance (SCI) and diffuse reflectance (SCE) based on wavelength of 55-inch display panels according to Comparative Example 2 and Example.

Total reflectance and diffuse reflectance may be measured using CM-2600D from Konica Minolta in the state in which a sensor is fixed at an angle of 8 degrees. For reference, CM-2600D can simultaneously measure SCI (di: 8) and SCE (di: 8), and can rapidly measure SCI and SCE using two pulse xenon lamps without mechanical movement, unlike a conventional spectrophotometer. In SCI, as previously described, measurement is performed including specularly reflected light, and the primary color of a sample is measured irrespective of the state of the surface of the sample. In SCE, measurement is performed excluding specularly reflected light, and a change in the visible color of a sample depending on the surface of the sample is measured.

Alternatively, DMS-803 may be used. In this case, a sensor moves to 0 to 60 degrees (theta), and a stage is moved to 0 to 360 degrees (phi) for measurement.

As previously described, for example, at a wavelength of 550 nm, the total reflectance and diffuse reflectance of Comparative Example 1 are 1.15 and 0.03, respectively.

Referring to FIG. 10, it can be seen that, in the Comparative Example 2 and Example (e.g., of FIG. 8), reflectance is increased as wavelength is increased.

For example, at a wavelength of 550 nm, the total reflectance and diffuse reflectance of Comparative Example 2, which has an MLA structure applied thereto, are 1.86 and 0.74, respectively.

That is, it can be seen that the total reflectance of Comparative Example 2, which has an MLA structure applied thereto, is increased by about 62% and that the diffuse reflectance of Comparative Example 2 is reduced by about 2400%, compared to those of Comparative Example 1. As a result, black visibility is lowered due to an increase in the diffuse component.

In contrast, at a wavelength of 550 nm, the total reflectance and diffuse reflectance of Example of the present invention, which has an MLA structure applied thereto, are 1.61 and 0.41, respectively.

That is, it can be seen that the total reflectance of Example is decreased by about 13% and the diffuse reflectance of Example is decreased by about 45%, compared to those of Comparative Example 2.

For reference, it can be seen that, at a wavelength of 450 nm, the total reflectance and diffuse reflectance of Example, which has an MLA structure applied thereto, are 1.88 and 0.38, respectively. In contrast, the total reflectance and diffuse reflectance of Comparative Example 2 are 2.38 and 0.64, respectively.

In addition, it can be seen that, at a wavelength of 650 nm, the total reflectance and diffuse reflectance of Example, which has an MLA structure applied thereto, are 3.47 and 0.92, respectively. In contrast, the total reflectance and diffuse reflectance of Comparative Example 2 are 4.07 and 1.57, respectively.

As previously described, the organic light-emitting display device according to the first embodiment of the present invention is configured such that the optical device is provided over the entire surface of the display panel. However, the present invention is not limited thereto. The present invention is also applicable to the case in which the optical device is disposed so as to correspond to a specific sub-pixel, e.g., a white sub-pixel, which will be described in detail with reference to a second embodiment of the present invention.

Figure 11:
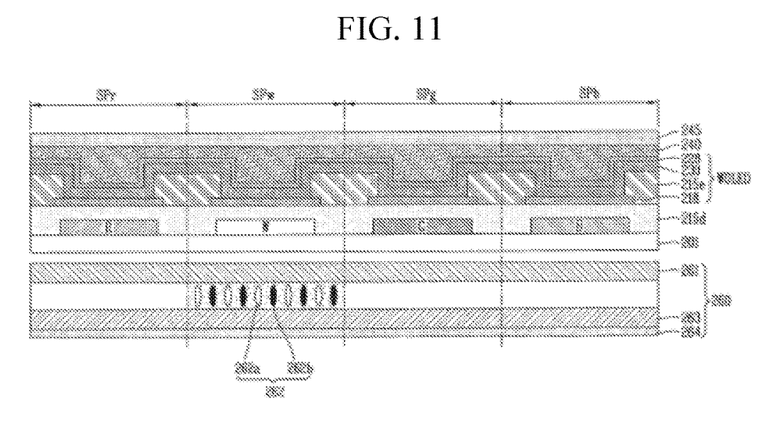
FIG. 11 is a sectional view exemplarily showing the structure of WRGB sub-pixels of an organic light-emitting display device according to a second embodiment of the present invention.

FIG. 11 is a sectional view exemplarily showing the structure of WRGB sub-pixels of an organic light-emitting display device according to a second embodiment of the present invention. Some elements, including a thin film transistor, are omitted from FIG. 11 for the sake of convenience.

Figure 12A:
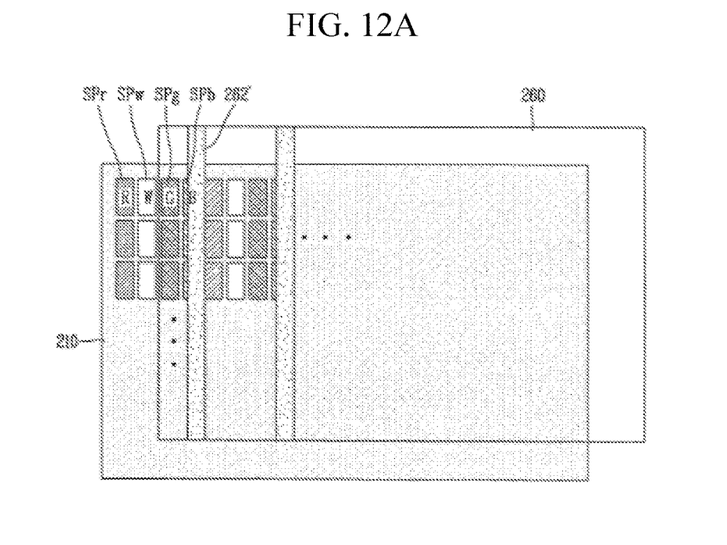
FIGS. 12A and 12B are exploded perspective views exemplarily showing the structure of the organic light-emitting display device according to the second embodiment of the present invention.
Figure 12B:
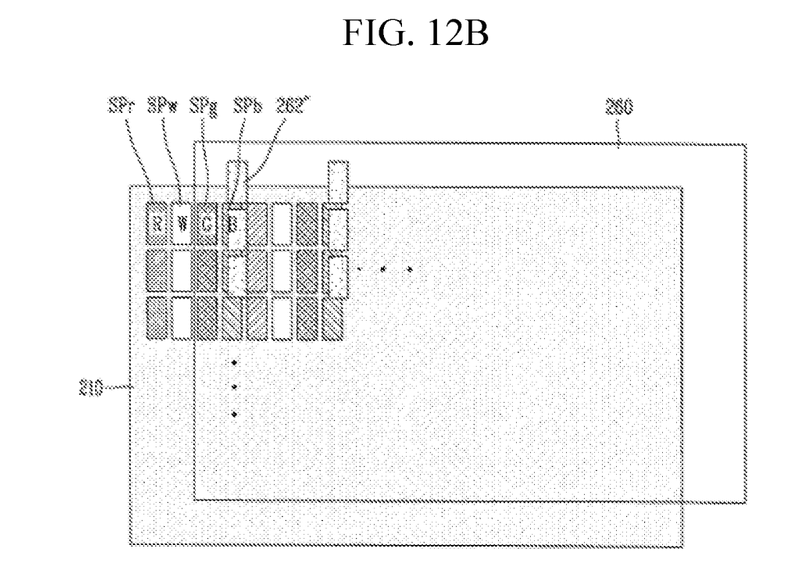

FIGS. 12A and 12B are exploded perspective views exemplarily showing the structure of the organic light-emitting display device according to the second embodiment of the present invention. The structure of a panel assembly including a display panel and an optical member is schematically shown.

The organic light-emitting display device shown in FIGS. 11, 12A, and 12B is a bottom emission type organic light-emitting display device, in which light is emitted toward a substrate in which pixels are arranged. However, the present invention is not limited thereto, as previously described. The present invention is also applicable to be a top emission type organic light-emitting display device, in which light is emitted toward the opposite side of a substrate in which pixels are arranged.

In the organic light-emitting display device shown in FIGS. 11, 12A, and 12B, for example, a WOLED that emits white light using at least two organic emission layers is used. In this case, RGB filters for converting white light into red, green, and blue light may be used, since the organic emission layers emit white light.

The organic light-emitting display device according to the second embodiment of the present invention includes a panel assembly for displaying an image and a flexible circuit board connected to the panel assembly, in the same or similar manner as in the first embodiment of the present invention.

Referring to FIGS. 11, 12A, and 12B, the panel assembly is formed on a substrate 201, and includes a display panel 210, which is divided into an active region and a pad region, and a thin film encapsulation layer 240 provided on the display panel 210 so as to cover the active region.

In a bottom emission structure, an optical member 260 according to the second embodiment of the present invention may be attached to the lower surface of the substrate 201 in order to prevent the reflection of light incident from outside.

In the active region of the display panel 210, a plurality of WRGB sub-pixels SPr, SPg, SPb, and SPw may be arranged in the form of a matrix.

The WRGB sub-pixels SPr, SPg, SPb, and SPw may be configured to use white organic light-emitting diodes WOLEDs and color filters R, G, B, and W. The white color filter W may be applied to the white sub-pixel SPw, or no color filter may be applied to the white sub-pixel SPw.

The RGB sub-pixels SPr, SPg, and SPb may include transistors TFT, RGB color filters R, G, and B, and white organic light-emitting diodes WOLEDs. For example, in the cases in which no color filter is applied to the white sub-pixel SPw, the white sub-pixel SPw may include a transistor TFT and a white organic light-emitting diode WOLED.

For example, the RGB sub-pixels SPr, SPg, and SPb include RGB color filters R, G, and B for converting white light emitted from the white organic light-emitting diodes WOLEDs into red, green, and blue light. In contrast, the white sub-pixel SPw may include no color filter, since white light emitted from the white organic light-emitting diode WOLED is output outside without being changed.

A sub-pixel, e.g., a red sub-pixel SPr, may include a transistor, a white organic light-emitting diode WOLED, and a red color filter R, formed on a substrate 201.

The transistor may be a drive thin film transistor, which includes a semiconductor layer, a gate electrode, a source electrode, and a drain electrode.

The semiconductor layer may be formed on a substrate 201 made of an insulating material, such as transparent plastic or a polymer film.

A gate insulation film made of a silicon nitride film SiNx or a silicon oxide film $SiO_2$ may be formed on the semiconductor layer, and a gate line including a gate electrode and a first maintenance electrode may be formed on the gate insulation film.

An inter-insulation layer made of a silicon nitride film or a silicon oxide film may be formed on the gate electrode, the gate line, and the first maintenance electrode, and a data line, a drive voltage line, source and drain electrodes, and a second maintenance electrode may be formed on the inter-insulation layer.

A passivation film (or a planarization film) may be formed on the substrate 201, on which the data line, the drive voltage line, the source and drain electrodes, and the second maintenance electrode are formed.

RGB color filters R, G, and B may be formed on the passivation film. The RGB color filters R, G, and B are color conversion materials for converting white light emitted from white organic light-emitting diodes WOLEDs into red, green, and blue light.

A red sub-pixel SPr, a green sub-pixel SPg, and a blue sub-pixel SPb may be provided with a red color filter R, a green color filter G, and a blue color filter B, respectively.

A white color filter W may be applied to a white sub-pixel SPw, or no color filter may be applied to a white sub-pixel SPw.

An overcoating layer 215d for exposing a portion of the drain electrode and a white organic light-emitting diode WOLED may be provided on the passivation film. The overcoating layer 215d may be made of an organic material having a refractive index of about 1.5. For example, the overcoating layer may be made of any one selected from among an acrylic resin, an epoxy resin, a phenol resin, a polyamide resin, a polyimide resin, an unsaturated polyester resin, a polyphenylene resin, a polyphenylene sulfide resin, benzocyclobutene, and a photoresist. However, the present invention is not limited thereto. The overcoating layer may be made of any insulating material having a refractive index of about 1.5.

The overcoating layer 215d may include a lens array formed so as to overlap the WRGB filters R, G, B, and W, in substantially the same manner as in the first embodiment of the present invention. The lens array may have a hemispherical shape or a semi-oval shape. The overcoating layer 215d functions as a planarization layer in a portion thereof at which the lens array is not formed.

A predetermined step reduction layer may be formed on the overcoating layer 215d. The step reduction layer may be made of a material having a higher refractive index than the overcoating layer 215d. For example, the step reduction layer may be made of a material having a refractive index of about 1.7 to 2.0. The step reduction layer is a layer for reducing the height of the step of the overcoating layer 215d formed by the lens array. That is, the step reduction layer is a layer for partially filling concave regions of the overcoating layer 215d formed by the lens array such that an organic layer 230 is not formed at peak points of the overcoating layer 215d between the lenses of the lens array and at points of the overcoating layer 215d at which the lens array is sharply inclined.

The white organic light-emitting diode WOLED may include a first electrode 218, an organic layer 230, and a second electrode 228.

The first electrode 218, the organic layer 230, and the second electrode 228 are formed along the upper surface of the overcoating layer 215d, which is a non-planarized surface formed by the lens array. Consequently, the first electrode 218, the organic layer 230, and the second electrode 228 have non-planarized upper and lower surfaces. For example, in the case in which the first electrode 218, the organic layer 230, and the second electrode 228 are formed by deposition, the first electrode 218, the organic layer 230, and the second electrode 228 have shapes formed according to the morphology of the surface at which the first electrode 218, the organic layer 230, and the second electrode 228 are formed.

Moisture may be directly diffused to the organic layer 230 due to outgassing occurring at the WRGB filters R, G, B, and W and the overcoating layer 215d, with the result that the white organic light-emitting diode WOLED may be deteriorated. In order to prevent this, a predetermined passivation film having a thickness of tens to hundreds of nm may be further deposited.

The white organic light-emitting diode WOLED is electrically connected to the drive thin film transistor.

The first electrode 218 may be formed on the overcoating layer 215d, and may be electrically connected to the drain electrode of the drive thin film transistor via a drain contact hole.

The first electrode 218, which supplies current (or voltage) to the organic layer 230, defines an emission region having therein a predetermined area.

A bank 215e may be formed on the substrate 201, on which the first electrode 218 is formed.

Four sub-pixels SPr, SPg, SPb, and SPw may be separated from each other by the bank 215e.

The organic layer 230 and the second electrode 228 may be sequentially formed on the substrate 201, on which the bank 215e is formed.

The organic layer 230 may be formed between the first electrode 218 and the second electrode 228. The organic layer 230 may include an organic emission layer that emits light through the coupling between holes supplied from the first electrode 218 and electrons supplied from the second electrode 228.

The organic layer 230 may be formed as a single layer that is continuous over all pixels. In this case, the organic emission layer may include an organic emission material that emits white light. In this case, RGB color filters R, G, and B may be provided for the RGB sub-pixels SPr, SPg, and SPb in order to express various colors. However, the present invention is not limited thereto.

As previously described, in the organic light-emitting display device according to the present invention having an MLA structure applied thereto, the upper surface of the overcoating layer 215d is patterned in a hemispherical shape so as to extract light captured in the display panel 210 outside, thereby improving the efficiency of an organic light-emitting device.

A capping layer made of an organic material, such as a polymer, may be formed on the substrate 201, on which the second electrode 228 is formed, so as to cover all portions of the substrate 201 corresponding to pixel portions. However, the present invention is not limited thereto. No capping layer may be provided.

A multi-layered thin film encapsulation layer 240 may be formed on the capping layer.

A multi-layered protective film 245 for encapsulation may be located so as to be opposite the entire surface of the substrate 201 including the thin film encapsulation layer 240. An adhesive may be provided between the substrate 201 and the protective film 245. However, the present invention is not limited thereto. The protective film 245 may not be provided.

As previously described, the optical member 260 according to the second embodiment of the present invention for preventing the reflection of light incident from outside may be provided under the substrate 201.

The optical member 260 according to the second embodiment of the present invention includes a phase difference layer 261, optical devices 262, 262', and 262", and a linear polarizer 263, which are sequentially formed under the substrate 201, in substantially the same manner as in the first embodiment of the present invention.

A surface treatment layer 264 made of TAC may be located on the linear polarizer 263.

The phase difference layer 261 may be made of a quarter wave plate (QWP) for generating a phase retardation of $\lambda/4$.

The linear polarizer 263 has a polarizing axis, and linearly polarizes light toward the polarizing axis.

The phase difference layer 261 and the linear polarizer 263 may constitute a circular polarizer. That is, when the optical axis of the phase difference layer 261 and the transmission axis of the linear polarizer 263 are disposed such that the angle therebetween is 45 degrees, external light is reflected in the display panel 210, and the reflected light exits in the state of being perpendicular to the transmission axis of the linear polarizer 263, whereby reflectance is decreased.

The optical devices 262, 262', and 262" according to the second embodiment of the present invention are located between the phase difference layer 261 and the linear polarizer 263, and each of the optical devices includes a reactive mesogen (RM) 262a and a dye 262b, in substantially the same manner as in the first embodiment of the present invention.

Each of the optical devices 262, 262', and 262" according to the second embodiment of the present invention is provided so as to correspond to a specific sub-pixel, e.g., a white sub-pixel SPw (see FIGS. 12A and 12B).

FIG. 12A shows, by way of example, the case in which the optical device 262' is formed in the shape of a stripe extending in the vertical direction of the display panel 210 so as to correspond to a plurality of white sub-pixels SPw arranged in the vertical direction. FIG. 12B shows, by way of example, the case in which the optical device 262" is formed in the shape of sub-pixels so as to correspond to a plurality of white sub-pixels SPw one by one. However, the present invention is not limited thereto.

The optical devices 262, 262', and 262" according to the second embodiment of the present invention are capable of preventing the reduction of reflection performance due to the application of the MLA structure. Particularly, in the second embodiment of the present invention, which is configured to correspond only to the white sub-pixels SPw, it is possible to minimize the reduction of luminance due to the application of the optical devices 262, 262', and 262". Consequently, the optical devices are provided so as to correspond only to the white sub-pixels SPw, to which no color filters are applied, whereby reflection performance is greatly reduced.

The RM 262a may be oriented perpendicular to the polarizing axis of the linear polarizer 263.

The dye 262b, which is a dichroic dye, is oriented perpendicularly in the same orientation direction as the perpendicularly-oriented RM 262a in order to absorb light spreading to a viewing angle. Since the light spreading to the viewing angle is blocked, it is possible to prevent the reduction of reflection performance due to the application of the MLA structure. In addition, the effect of the dye 262b, which absorbs light, on the front may be minimized, since the dye 262b is a perpendicularly-oriented dye.

For example, a liquid crystalline polymer, a liquid crystalline small molecule, or an oligomer having a photosensitive group exhibiting optical anisotropy due to linearly polarized light radiated from outside and a mesogen-forming group exhibiting liquid crystallinity within a specific temperature range or a mixture thereof may be used as the RM 262a of the present invention. However, the present invention is not limited thereto.

Each of the optical devices 262, 262', and 262" may be mixed with a black-based dichroic dye 262b, in addition to the RM 262a. That is, the dye 262b may be a black dichroic dye obtained by mixing three or more kinds of CMY (or RGB) dyes. The dye 262b is arranged along a side chain of the RM 262a. That is, the dye 262 is arranged in a specific direction. When light is incident, therefore, the polarized component that is parallel to the arrangement direction of the dye, i.e., the absorption direction of the dye, is absorbed, and the polarized component that is perpendicular to the absorption direction of the dye is transmitted.

Each of the optical devices 262, 262', and 262" according to the present invention has +C plate characteristics, in which a refractive index nx in the x-axis direction and a refractive index ny in the y-axis direction are substantially equal and these refractive indices are less than a refractive index nz in the z-axis direction (i.e., the orientation direction of the RM 262a).

As is apparent from the above description, an MLA structure is applied to an organic light-emitting display device according to an embodiment of the present invention, whereby efficiency is improved and light spreading to a viewing angle is blocked. Consequently, the present invention has the effect of preventing or minimizing the reduction of reflection performance due to the application of the MLA structure.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. An organic light-emitting display device comprising:
   a substrate partitioned into a plurality of RGB sub-pixels and white sub-pixels;
   RGB color filters disposed respectively at emission regions of the RGB sub-pixels;
   an overcoating layer provided on the substrate including the RGB color filters, the overcoating layer comprising a lens array provided at an emission region of each of the sub-pixels;
   an organic light-emitting diode at each of the plurality of RGB sub-pixels and white sub-pixels provided on the overcoating layer, wherein at least one organic light emitting layer between a first electrode and a second electrode is commonly positioned in all organic light-emitting diodes over the plurality of RGB sub-pixels and white sub-pixels; and
   an optical member provided under the substrate, the optical member comprising a phase difference layer, an optical device, and a linear polarizer,
   wherein the optical device is located between the phase difference layer and the linear polarizer to overlap at least the RGB color filters,
   wherein the optical device comprises a reactive mesogen and a black-based dichroic dye,
   wherein, at the white sub-pixels, a light generated from the organic light emitting layer is passed through the first electrode, the overcoating layer comprising the lens array, the substrate, the phase difference layer, the optical device and the linear polarizer,
   wherein, at the plurality of RGB sub-pixels, the light generated from the organic light emitting layer is passed through the first electrode, the overcoating layer comprising the lens array, the RGB color filters, the substrate, the phase difference layer and the linear polarizer,
   wherein the reactive mesogen includes a polyacrylate main chain and at least one side chain connected to the polyacrylate main chain, and
   wherein one of a photoreactive material and a hydrogen-coupling group is provided as a terminal group of the at least one side chain of the reactive mesogen.

2. The organic light-emitting display device according to claim 1, wherein the lens array is located at a portion of the overcoating layer that overlaps each of the RGB color filters.

3. The organic light-emitting display device according to claim 1, wherein the lens array has a hemispherical shape or a semi-oval shape.

4. The organic light-emitting display device according to claim 1, wherein the phase difference layer is made of a quarter wave plate.

5. The organic light-emitting display device according to claim 1, wherein the reactive mesogen is oriented perpendicular to a polarizing axis of the linear polarizer.

6. The organic light-emitting display device according to claim 5, wherein the black-based dichroic dye is oriented perpendicularly in a same orientation direction as the perpendicularly-oriented reactive mesogen.

7. The organic light-emitting display device according to claim 1, wherein the optical device is formed in a stripe shape extending in one direction so as to correspond to the RGB sub-pixels and the white sub-pixels arranged in the one direction.

8. The organic light-emitting display device according to claim 1, wherein the optical device is formed in a shape of sub-pixels so as to correspond to the RGB sub-pixels, and the white sub-pixels one by one.

9. The organic light-emitting display device according to claim 1, wherein the lens array in the overcoating layer includes a plurality of concave portions, adjacent concave portions being connected by projections, and an uppermost part of each of the protections has a vertex portion.

10. The organic light-emitting display device according to claim 1, wherein the reactive mesogen and the black-based dichroic dye in the optical device suppress diffused light intensity in a reflection light intensity of all wavelengths in the organic light-emitting display device.

* * * * *